United States Patent
Harada

(10) Patent No.: US 8,416,114 B2
(45) Date of Patent: Apr. 9, 2013

(54) A/D CONVERSION CIRCUIT

(75) Inventor: Yasunari Harada, Ebina (JP)

(73) Assignees: Olympus Corporation, Tokyo (JP); Denso Corporation, Kariya-shi, Aichi (JP)

( * ) Notice: Subject to any disclaimer, the term of this patent is extended or adjusted under 35 U.S.C. 154(b) by 100 days.

(21) Appl. No.: 13/046,923

(22) Filed: Mar. 14, 2011

(65) Prior Publication Data

US 2011/0221621 A1 Sep. 15, 2011

(30) Foreign Application Priority Data

Mar. 15, 2010 (JP) .................................. 2010-057907

(51) Int. Cl.
*H03M 1/50* (2006.01)
(52) U.S. Cl.
USPC ........... 341/166; 341/155; 341/156; 327/160; 327/161
(58) Field of Classification Search .................. 341/157, 341/155, 166; 327/160, 161; 375/360
See application file for complete search history.

(56) References Cited

U.S. PATENT DOCUMENTS

| | | | | |
|---|---|---|---|---|
| 5,999,586 | A * | 12/1999 | Terada et al. | 377/20 |
| 6,100,768 | A * | 8/2000 | Hirayama | 331/57 |
| 7,248,197 | B2 * | 7/2007 | Watanabe | 341/157 |
| 7,864,093 | B2 * | 1/2011 | Oba | 341/157 |

FOREIGN PATENT DOCUMENTS

JP 06-216721 A 8/1994

* cited by examiner

*Primary Examiner* — Jean B Jeanglaude
(74) *Attorney, Agent, or Firm* — Westerman, Hattori, Daniels & Adrian, LLP

(57) ABSTRACT

An A/D conversion circuit includes a pulse transit circuit, first and second pulse transit position detection circuits, and a digital signal generation circuit. The first pulse transit position detection circuit detects a transit position of the pulse signal output from the pulse transit circuit and generates a logical signal according to the transit position. The second pulse transit position detection circuit detects the circling number of the pulse signal output from the pulse transit circuit and generates a logical signal according to the circling number. The digital signal generation circuit synthesizes the logical signals output from the first and second pulse transit position detection circuits and generates a digital signal according to a size of an analog signal VA. The pulse transit circuit is configured so that a sum of the number of the inverting circuits that the pulse signal transits in an N-th period (N denotes a natural number) and the number of the inverting circuits that the pulse signal transits in an (N+1)-th period is a power of 2.

4 Claims, 16 Drawing Sheets

FIG. 2
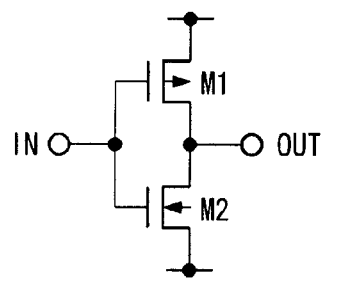
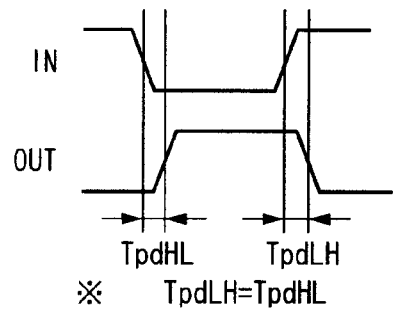
FIG. 3
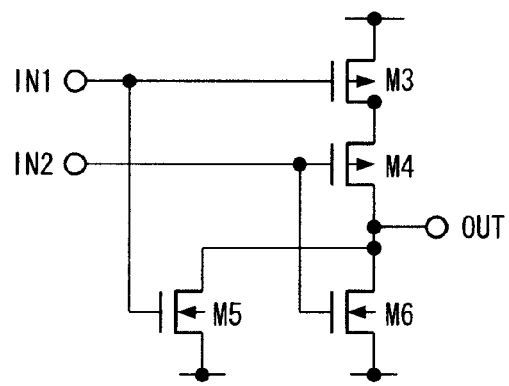
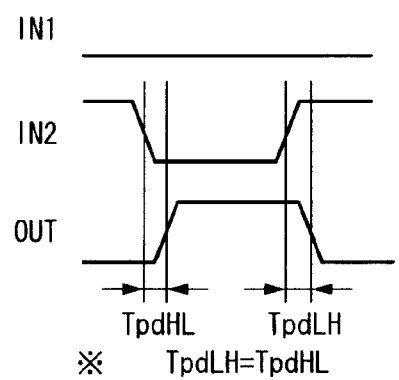

FIG. 5

| TIME | PERIOD | D1 | D2 | D3 | D4 | D5 | D6 | D7 | D8 | D9 | SAME LOGIC POSITION | PULSE TRANSIT POSITION | OUTPUT LOGIC | D10 OUTPUT |
|---|---|---|---|---|---|---|---|---|---|---|---|---|---|---|
| 305 | N | H | H | L | H | L | H | L | H | L | D1,2 | D1 | H | 0001 |
| 306 | N | H | L | L | H | L | H | L | H | L | D2,3 | D2 | L | 0010 |
| 307 | N | H | L | H | H | L | H | L | H | L | D3,4 | D3 | H | 0011 |
| 308 | N | H | L | H | L | L | H | L | H | L | D4,5 | D4 | L | 0100 |
| 309 | N | H | L | H | L | H | H | L | H | L | D5,6 | D5 | H | 0101 |
| 310 | N | H | L | H | L | H | L | L | H | L | D6,7 | D6 | L | 0110 |
| 311 | N | H | L | H | L | H | L | H | H | L | D7,8 | D7 | H | 0111 |
| 312 | N | H | L | H | L | H | L | H | L | L | D8,9 | D8 | L | 1000 |
| 313 | N | H | L | H | L | H | L | H | L | H | D9,1 | D9 | H | 1001 |
| 314 | N+1 | L | L | H | L | H | L | H | L | H | D1,2 | D1 | L | 1010 |
| 315 | N+1 | L | H | H | L | H | L | H | L | H | D2,3 | D2 | H | 1011 |
| 316 | N+1 | L | H | L | L | H | L | H | L | H | D3,4 | D3 | L | 1100 |
| 317 | N+1 | L | H | L | H | H | L | H | L | H | D4,5 | D4 | H | 1101 |
| 318 | N+1 | L | H | L | H | L | L | H | L | H | D5,6 | D5 | L | 1110 |
| 319 | N+1 | L | H | L | H | L | H | H | L | H | D6,7 | D6 | H | 1111 |
| 320 | N+1 | L | H | L | H | L | H | L | H | L | D9,1 | D9 | L | 0000 |
| 321 | N+2 | H | H | L | H | L | H | L | H | L | D1,2 | D1 | H | 0001 |

※ TpdLH < TpdHL

※ TpdLH < TpdHL

※ TpdLH > TpdHL

※ TpdLH > TpdHL

PRIOR ART
FIG. 19A
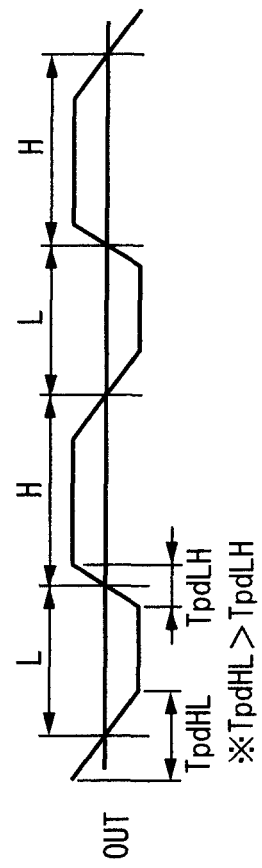
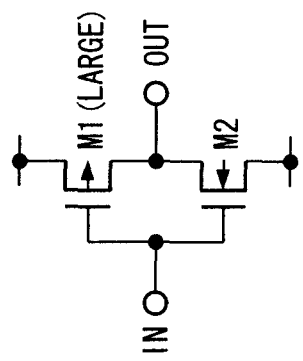
PRIOR ART
FIG. 19B
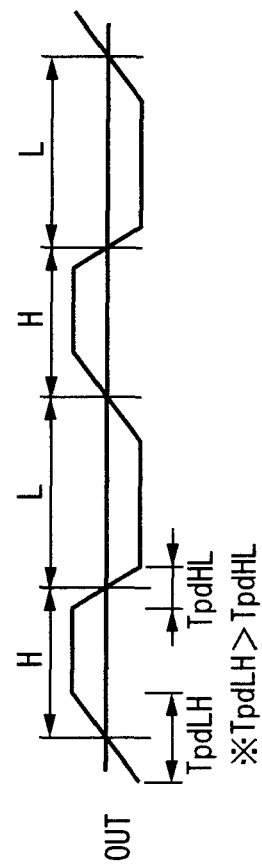
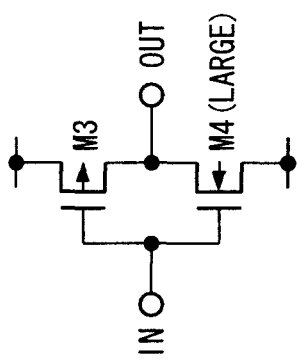

A/D CONVERSION CIRCUIT

BACKGROUND OF THE INVENTION

1. Field of the Invention

The present invention relates to an A/D conversion circuit for converting an analog signal into a digital signal in a time domain.

This application claims a priority based on Japanese Patent Application No. 2010-057907 filed on Mar. 15, 2010, the entire contents of which is incorporated hereby by reference.

2. Description of Related Art

There is conventional technique of converting an analog signal to a digital signal in a time domain using inverting circuits including logical elements in which a delay time of a pulse signal is changed with a size of an analog signal (analog input signal) applied as a supply voltage. For example, a pulse phase difference encoding circuit including a ring oscillator, in which the power of 2 inverting circuits are connected and a pulse signal circles the inverting circuits, is disclosed in Japanese Patent No. 3455982. In the pulse phase difference encoding circuit, a transit position and a circling number of the pulse signal are detected from the ring oscillator, and a digital signal is generated from the transit position and the circling number of the pulse signal according to a size of an analog signal.

FIG. 12 shows a configuration of the pulse phase difference encoding circuit disclosed in Japanese Patent No. 3455982. The pulse phase difference encoding circuit 200 shown in FIG. 12 includes a ring oscillator 40, a pulse selector and encoder 41, a counter and latch 42, and a multiplexer 43.

The ring oscillator 40 has a configuration in which a power of 2-stage (32-stage) inverting circuits NAND1, INV2 to INV31, and NAND32 are connected in series. The inverting circuits are connected in the order of NAND1, INV2 to INV31, and NAND32. An external driving signal PA is input to one input terminal of NAND 1, and an output signal from NAND32 is input to the other input terminal of NAND1. An output signal from INV18 is input to one input terminal of NAND32, and an output signal from INV31 is input to the other input terminal of NAND32. Accordingly, a pulse signal based on the driving signal PA input to the ring oscillator 40 circles the inverting circuits in the ring oscillator 40. Further, an external analog input signal VA is applied for the highest potential for all the inverting circuits in the ring oscillator 40, and GND is applied for the lowest potential for all the inverting circuits.

The pulse selector and encoder 41 detects a transit position of the pulse signal transiting the ring oscillator 40, in synchronization with an external control signal PB, based on output signals D1 to D32 from the inverting circuits in the ring oscillator 40, encodes the transit position, and outputs the encoded transit position to the multiplexer 43 of a subsequent stage. An output signal D33 indicating the encoded transit position, which is output from the pulse selector and encoder 41, is for example a 4-bit digital signal.

Based on the output signal D32 from the NAND 32, the counter and latch 42 detects a circling number of the pulse signal transiting the ring oscillator 40 (the number of pulse signals detected from the output signal D32) in synchronization with the external control signal PB, and outputs the circling number to the multiplexer 43 of the subsequent stage. An output signal D34 indicating the circling number, which is output from the counter and latch 42, is for example a 6-bit digital signal.

The multiplexer 43 synthesizes the transit position D33 of the pulse signal detected by the pulse selector and encoder 41 with the circling number D34 of the pulse signal detected by the counter and latch 42, in which the transit position D33 forms lower bits and the circling number D34 forms upper bits, to thereby generate a digital signal according to a size of the analog input signal VA in synchronization with the external control signal PB, and outputs the digital signal to a circuit of a subsequent stage, which is not shown. A digital signal DA output from the multiplexer 43 is, for example, a 10-bit signal.

A correspondence relationship in configuration between a pulse phase difference encoding circuit 4 shown in FIG. 3 of Japanese Patent No. 3455982 and the pulse phase difference encoding circuit 200 shown in FIG. 12 is as follows:

Even-stage ring oscillator 2=ring oscillator 40
Pulse selector 6 and encoder 8=pulse selector and encoder 41
Counter 10 and latch 12=counter and latch 42
Multiplexer 18=multiplexer 43

In order for the pulse signal to stably circle the ring oscillator 40 including the power of 2-stage (32-stage) inverting circuits, it is necessary to cause two pulse signals (a main pulse and a reset pulse) to transit the ring oscillator 40, as shown in FIGS. 13 and 14. FIGS. 13 and 14 show logical states of the respective inverting circuits in the ring oscillator 40. Numbers 1, 2 to 31, and 32 shown in a top of FIGS. 13 and 14 correspond to NAND1, INV2 to INV31, and NAND32.

The main pulse is a pulse signal that iteratively transits all the inverting circuits from NAND1 to NAND32 in a period of time in which the external driving signal PA is at an "H" level. Further, the reset pulse is a pulse signal that transits all the inverting circuits from NAND32 to INV3 only in one period in the period of time in which the external driving signal PA is at the "H" level. The reset pulse is a pulse for resetting a logical state of each inverting circuit, which is inverted by the transit of the main pulse, to an initial state. "The reset pulse transiting only in one period" means that the reset pulse is extinct every period and is newly generated by the main pulse.

Specifically, at a time 0, each inverting circuit outputs a signal in a logical state shown in FIG. 13. At a time 1, the output of NAND 1 is inverted from an "H" level to an "L" level by the driving signal PA, and the main pulse starts transit of a first period. At a time 19, the reset pulse is generated when an output of NAND 32 is inverted from an "H" level to an "L" level by the main pulse at an "H" level output by INV18 at a time 18, and the reset pulse begins to transit.

At a time 33, the output of NAND1 is inverted from the "H" level to the "L" level by a main pulse at an "H" level output by NAND32 at a time 32, and the main pulse starts transit of a second period. At a time 51, the output of NAND 32 is inverted from the "H" level to the "L" level by a main pulse at an "H" level output by INV18 and a reset pulse at an "H" level output by INV31 at a time 50, to thereby generate a new reset pulse, and the reset pulse begins to transit. Even in subsequent times, the main pulse and the reset pulse transit the ring oscillator 40, as described above.

As described above, the main pulse iteratively transits all the inverting circuits from NAND1 to NAND32 as the output of NAND 32 is inverted from the "L" level to the "H" level by the transit of the main pulse. On the other hand, the reset pulse transits all the inverting circuits from NAND32 to INV31 only in one period as the output of INV18 is inverted from the "L" level to the "H" level by the transit of the main pulse.

When an odd number of inverting circuits are connected in series and an output signal from the inverting circuit of the last stage is input to the inverting circuit of the first stage, an oscillation operation can be performed through circling of one pulse signal. However, when an even numbers of inverting circuits are connected in series and an output signal from the inverting circuit of the last stage is input to the inverting circuit of the first stage, the logical state of each inverting circuit is fixed when one pulse signal is circled, and the oscillation operation cannot be performed.

Here, when the even number of inverting circuits are connected in series and the output signal from the inverting circuit of the last stage is input to the inverting circuit of the first stage, the oscillation operation can be performed through the transit of the two pulse signals (the main pulse and the reset pulse), as described above.

In order for the ring oscillator 40 to perform the oscillation operation through the transit of the two pulse signals, it is necessary to settle a logical state of INV31 earlier than a logical state of INV18, in an inverting operation according to the transit start of the reset pulse. For example, when both outputs of INV18 and INV31 are inverted from the "L" level to the "H" level at a time 50 of FIG. 14, an output of NAND 32 is inverted from the "H" level to the "L" level at a time 51 and the reset pulse starts the transit. However, when the relationship that the output of INV31 reaches the "H" level earlier than that of INV18 is not satisfied, the reset pulse is extinct and the ring oscillator 40 cannot perform the oscillation operation.

Thereby, as shown in FIGS. 17 and 18, in the inverting circuit of the even stage, a time period from an input signal being changed from the "H" level to a middle potential and an output signal being changed from the "L" level to the middle potential (hereinafter, TpdLH) is set to be longer than a time period from an input signal being changed from the "L" level to a middle potential to the output signal being changed from the "H" level to the middle potential (hereinafter, TpdHL). FIG. 17 corresponds to INV2, INV4, . . . , INV30, and FIG. 18 corresponds to NAND32. Further, as shown in FIGS. 15 and 16, in the inverting circuit of the odd stage, TpdLH is set to be shorter than TpdHL. FIG. 15 corresponds to INV3, INV5, . . . , INV31, and FIG. 16 corresponds to NAND 1.

According to the settings shown in FIGS. 15 to 18, when the input signal of the inverting circuit is changed from the "H" level to the "L" level, the output signal of the inverting circuit is changed from the "L" level to the "H" level, but a delay time (TpdLH) in the inverting circuit of the odd stage at this time is set to be shorter than that in the inverting circuit of the even stage. When the input signal of the inverting circuit is changed from the "L" level to the "H" level, the output signal of the inverting circuit is changed from the "H" level to the "L" level, but a delay time (TpdHL) in the inverting circuit of the even stage at this time may be set to be shorter than that in the inverting circuit of the odd stage. Thereby, when an output of the inverting circuit of a previous stage is inverted from the "L" level to the "H" level, the output of INV31 reaches the "H" level earlier than that of INV18.

When TpdHL>TpdLH, a time period of the "H" level is longer than that of the "L" level, and when TpdLH>TpdHL, the time period of the "H" level is shorter than that of the "L" level. FIG. 19A shows time periods of "H" and "L" levels in the inverting circuit of the odd stage, and FIG. 19B shows time periods of "H" and "L" levels in the inverting circuit of the even stage. In the examples of FIGS. 19A and 19B, when the time periods of the "H" and "L" levels are $T_{H1}$ and $T_{L1}$ in the inverting circuit of the even stage and the time periods of the "H" and "L" levels are $T_{H2}$ and $T_{L2}$ in the inverting circuit of the odd stage, $T_{H1} \neq T_{L1}$ and $T_{H2} \neq T_{L2}$, and $T_{H1} \neq T_{H2}$ and $T_{L1} \neq T_{L2}$, respectively.

The pulse selector and encoder 41 detects a logical state of each inverting circuit, i.e., the transit position of the pulse signal at the same time intervals in synchronization with the external control signal PB based on the output signals D1 to D32 from the respective inverting circuits. However, when the transit position of the pulse signal is not detected from an output of a circuit as a minimum unit, which is one set of the inverting circuit of the even stage and the inverting circuit of the odd stage, due to a difference between TpdLH and TpdHL in each inverting circuit as described above, the transit position of the pulse signal cannot be detected at the same time intervals.

SUMMARY OF THE INVENTION

According to one aspect of the present invention, an A/D conversion circuit includes a pulse transit circuit including inverting circuits, each inverting circuit including a logical element in which a delay time of an output pulse signal is changed with a size of an applied analog signal, the inverting circuits being connected as odd stages, an output signal from the inverting circuit of a last stage being input to an inverting circuit of a first stage, and an output signal from the inverting circuit of arbitrary stage being input to both the inverting circuit of a first subsequent stage and the inverting circuit of any other subsequent stage; a first pulse transit position detection circuit for detecting a transit position of the pulse signal output from the pulse transit circuit and generating a logical signal according to the transit position; a second pulse transit position detection circuit for detecting a circling number of the pulse signal output from the pulse transit circuit and generating a logical signal according to the circling number; and a digital signal generation circuit for synthesizing the logical signals output from the first and second pulse transit position detection circuits and generating a digital signal according to the size of the analog signal, wherein the pulse transit circuit is configured so that a sum of the number of the inverting circuits that the pulse signal transits in an N-th period (N denotes a natural number) and the number of the inverting circuits that the pulse signal transits in an (N+1)-th period is a power of 2.

Preferably, an output signal from the inverting circuit of arbitrary stage in the pulse transit circuit may be input to both the inverting circuit of the first subsequent stage and the inverting circuit of a third subsequent stage.

Preferably, each inverting circuit may include a NOR circuit.

Preferably, each inverting circuit may include a NAND.

BRIEF DESCRIPTION OF THE DRAWINGS

FIG. 2 is a reference diagram showing a characteristic of an inverting circuit according to an embodiment of the present invention.

FIG. 3 is a reference diagram showing a characteristic of an inverting circuit according to an embodiment of the present invention.

FIG. 5 is a reference diagram showing a method of decoding a transit position of a pulse signal according to an embodiment of the present invention.

FIG. 19A is a reference diagram showing a characteristic of a conventional inverting circuit.

FIG. 19B is a reference diagram showing a characteristic of a conventional inverting circuit.

DETAILED DESCRIPTION OF THE INVENTION

Figure 1:
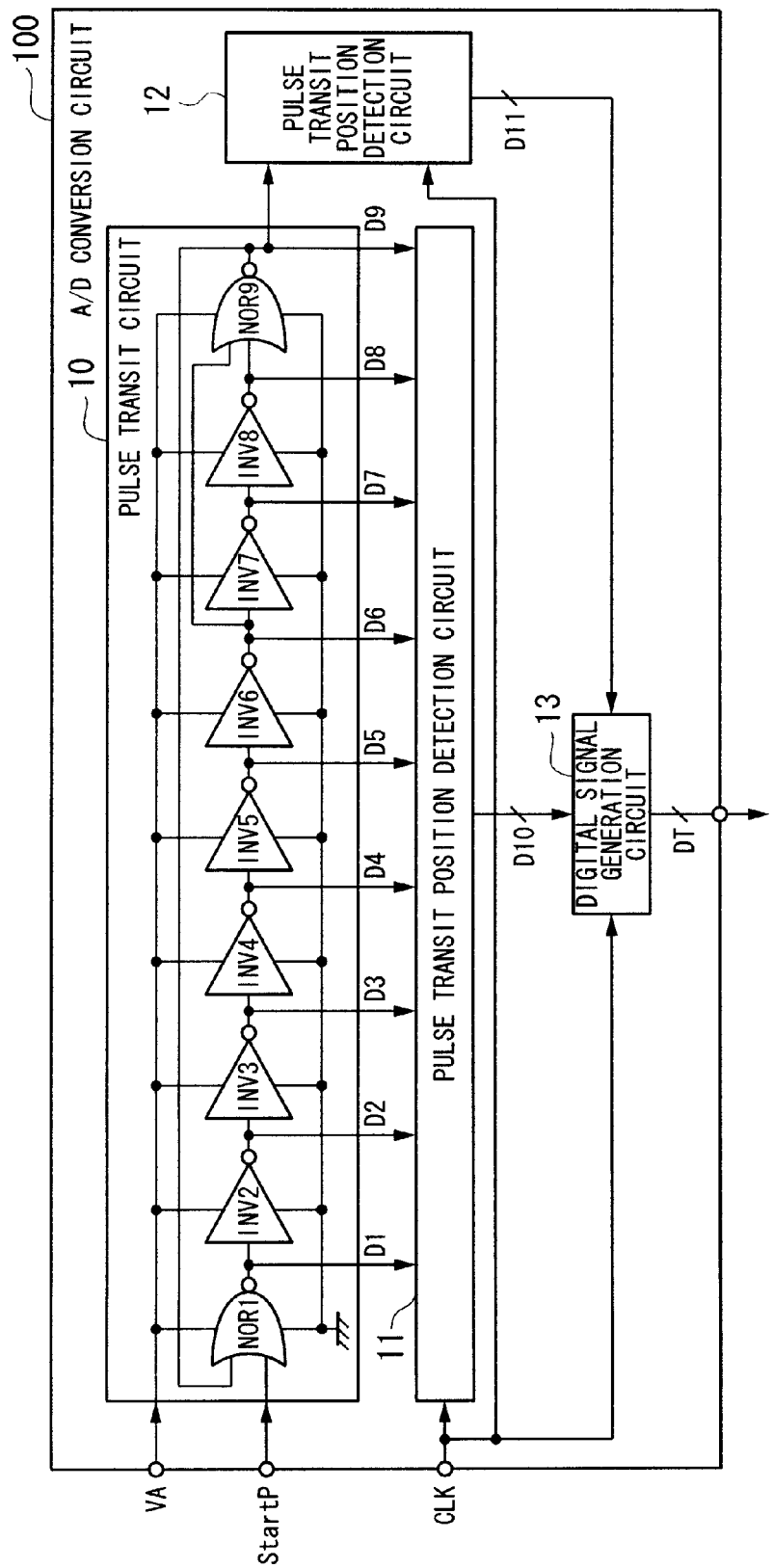
FIG. 1 is a block diagram showing a configuration of an A/D conversion circuit according to an embodiment of the present invention.

Hereinafter, an embodiment of the present invention will be described with reference to the accompanying drawings. FIG. 1 shows a configuration of an A/D conversion circuit according to an embodiment of the present invention. The A/D conversion circuit 100 shown in FIG. 1 includes a pulse transit circuit 10, a pulse transit position detection circuit 11, a pulse transit position detection circuit 12, and a digital signal generation circuit 13.

The pulse transit circuit 10 has a configuration in which an odd number of stages (9 stages in FIG. 1) of inverting circuits (NOR1, INV2 to INV8, and NOR9) are connected in series. The inverting circuits are connected in order of NOR1, INV2 to INV8, and NOR9. An external drive control signal StartP is input to one input terminal of NOR1, and an output signal D9 from NOR9 is input to the other input terminal of NOR1. An output signal D1 from NOR1 is input to an input terminal of INV2. An output signal D2 from INV2 is input to an input terminal of INV3. An output signal D3 from INV3 is input to an input terminal of INV4. An output signal D4 from INV4 is input to an input terminal of INV5. An output signal D5 from INV5 is input to an input terminal of INV6. An output signal D6 from INV6 is input to an input terminal of INV7. An output signal D7 from INV7 is input to an input terminal of INV8. An output signal D8 from INV8 is input to one input terminal of NOR9, and the output signal D6 from INV6 is input to the other input terminal of NOR9.

Accordingly, a pulse signal based on the drive control signal StartP input to the pulse transit circuit 10 circles the inverting circuits in the pulse transit circuit 10. Further, an external analog input signal VA is applied for the highest potential for all the inverting circuits in the pulse transit circuit 10, and GND is applied for the lowest potential.

The pulse transit position detection circuit 11 detects a transit position of the pulse signal transiting the pulse transit circuit 10 in synchronization with an external control signal CLK based on output signals D1 to D9 from the inverting circuits in the pulse transit circuit 10, encodes the transit position, and outputs the encoded transit position to the digital signal generation circuit 13 of a subsequent stage. An output signal D10 indicating the encoded transit position, which is output from the pulse transit position detection circuit 11, is for example a 4-bit digital signal.

The pulse transit position detection circuit 12 detects a circling number of the pulse signal transiting the pulse transit circuit 10 (the number of pulse signals detected from the output signal D9) in synchronization with the external control signal CLK. Further, the pulse transit position detection circuit 12 outputs the detected circling number (D11) to the digital signal generation circuit 13 of the subsequent stage. An output signal D11 indicating the circling number, which is output from the pulse transit position detection circuit 12, is for example a 6-bit digital signal.

The digital signal generation circuit 13 synthesizes the output signal D10 and the output signal D11 assigning the transit position of the pulse signal (D10) detected by the pulse transit position detection circuit 11 to lower bits and the circling number of the pulse signal detected by the pulse signal (D11) detected by the pulse transit position detection circuit 12 to upper bits. The digital signal generation circuit 13 synchronizes the output signal D11 with the external control signal CLK and generates a digital signal DT according to a size of the analog input signal VA. The digital signal generation circuit 13 outputs the digital signal DT to a circuit of a subsequent stage, which is not shown. The digital signal DT output from the digital signal generation circuit 13 is, for example, a 10-bit signal.

In each of the inverting circuits (NOR1, INV2 to INV8, and NOR9), as shown in FIGS. 2 and 3, a time period (TpdLH) from an input signal of each inverting circuit being changed from an "H" level to a middle potential to an output signal being changed from an "L" level to a middle potential is set to be substantially equal to a time period (TpdHL) from the input signal of each inverting circuit being changed from the "L" level to a middle potential to the output signal being changed from the "H" level to the middle potential. FIG. 2 corresponds to INV2 to INV8, and FIG. 3 corresponds to NOR1 and NOR9.

According to the settings shown in FIGS. 2 and 3, delay times in the respective inverting circuits are substantially the same either when the input signal is changed from the "H" level to the "L" level or when the input signal is changed from the "L" level to the "H" level. Accordingly, transit intervals of the pulse signals (time periods H and L in the output signals of the respective inverting circuits) are the same and the transit position of the pulse signal can be detected from the output signal of each inverting circuit at the same time intervals. The settings shown in FIGS. 2 and 3 can be realized by adjusting a size of a transistor in each inverting circuit according to carrier mobility in the transistor. Alternatively, the settings shown in FIGS. 2 and 3 may be realized by making wiring lengths between the inverting circuits the same.

Figure 4:
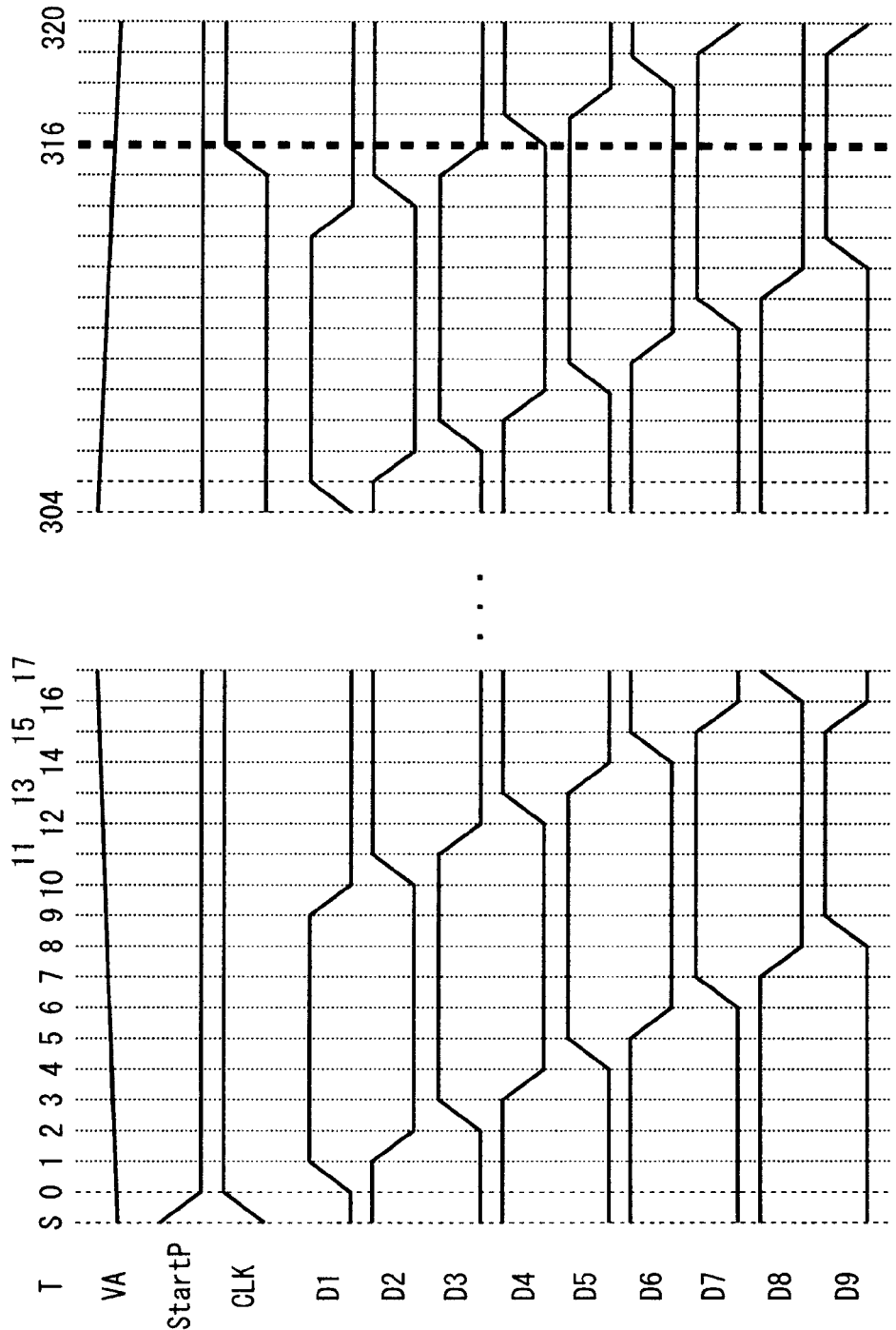
FIG. 4 is a timing chart showing operation of the A/D conversion circuit according to an embodiment of the present invention.

Next, an example of operation of the A/D conversion circuit 100 configured as described above will be described in connection with a timing chart. FIG. 4 shows the example of the operation of the A/D conversion circuit 100 according to the present embodiment.

(Time TS: Standby Period of Pulse Transit Circuit 10)

The drive control signal StartP at an "H" level is input to NOR1, output signals D2, D4, D6 and D8 of the pulse transit circuit 10 are held at an "H" level, and output signals D1, D3, D5, D7 and D9 are held at an "L" level.

(Time T0: Operation Start Period of Pulse Transit Circuit 10)

The drive control signal StartP at an "L" level and the output signal at an "L" level from NOR9 are input to NOR1, and each inverting circuit begins to output pulse signals D1 to D9 according to the analog input signal VA. Further, the external control signal CLK at an "H" level is input to the pulse transit position detection circuit 11 and the pulse transit position detection circuit 12, and the pulse transit position detection circuit 11 begins to detect a transit position D10 of the pulse signal transiting the pulse transit circuit 10, and the pulse transit position detection circuit 12 begins to detect the circling number D11 of the pulse signal transiting the pulse transit circuit 10.

(Time T1: Operation Period of Pulse Transit Circuit 10)

When the drive control signal StartP at the "L" level and the output signal at the "L" level from NOR9 are input to NOR1, the output signal D1 of NOR1 is changed from the "L" level to the "H" level and the other output signals D2 to D9 are held at logics in times TS and T0.

(Time T2: Operation Period of Pulse Transit Circuit 10)

When the output signal D1 at the "H" level from NOR1 is input to INV2, the output signal D2 of INV2 is changed from the "H" level to the "L" level and the other output signals D1, D3 to D9 are held at the logic at the time T1.

(Time T3: Operation Period of Pulse Transit Circuit 10)

When the output signal D2 at the "L" level from INV2 is input to INV3, the output signal D3 of INV3 is changed from the "L" level to the "H" level and the other output signals D1, D2, D4 to D9 are held at the logic at the time T2.

(Time T4: Operation Period of Pulse Transit Circuit 10)

When the output signal D3 at the "H" level from INV3 is input to INV4, the output signal D4 of INV4 is changed from the "H" level to the "L" level and the other output signals D1 to D3, D5 to D9 are held at the logic at the time T3.

(Time T5: Operation Period of Pulse Transit Circuit 10)

When the output signal D4 at the "L" level from INV4 is input to INV5, the output signal D5 of INV5 is changed from the "L" level to the "H" level and the other output signals D1 to D4 and D6 to D9 are held at the logic at the time T4.

(Time T6: Operation Period of Pulse Transit Circuit 10)

When the output signal D5 at the "H" level from INV5 is input to INV6, the output signal D6 of INV6 is changed from the "H" level to the "L" level and the other output signals D1 to D5, and D7 to D9 are held at the logic at the time T5.

(Time T7: Operation Period of Pulse Transit Circuit 10)

When the output signal D6 at the "L" level from INV6 is input to INV7, the output signal D7 of INV7 is changed from the "L" level to the "H" level, and the other output signals D1 to D6, D8, and D9 are held at the logic at a time T6. Since the output signal D6 at the "L" level from INV6 and the output signal D8 at the "H" level from INV8 are input to NOR9, the output signal D9 of NOR9 is held at the "L" level.

(Time T8: Operation Period of Pulse Transit Circuit 10)

When the output signal D7 at the "H" level from INV7 is input to INV8, the output signal D8 of INV8 is changed from the "H" level to the "L" level, and the other output signals D1 to D7, and D9 are held at the logic at the time T7.

(Time T9: Operation Period of Pulse Transit Circuit 10)

When the output signal D8 at the "L" level from INV8 is input to NOR9, the output signal D9 of NOR9 is changed from the "L" level to the "H" level, and the other output signals D1 to D8 are held at the logic at the time T8.

(Time T10: Operation Period of Pulse Transit Circuit 10)

When the output signal D9 at the "H" level from NOR9 is input to NOR1, the output signal D1 of NOR1 is changed from the "H" level to the "L" level, and the other output signals D2 to D9 are held at the logic at the time T9.

(Time T11: Operation Period of Pulse Transit Circuit 10)

When the output signal D1 at the "L" level from NOR1 is input to INV2, the output signal D2 of INV2 is changed from the "L" level to the "H" level, and the other output signals D1, and D3 to D9 are held at the logic at the time T10.

(Time T12: Operation Period of Pulse Transit Circuit 10)

When the output signal D2 at the "H" level from INV2 is input to INV3, the output signal D3 of INV3 is changed from the "H" level to the "L" level, and the other output signals D1, D2, and D4 to D9 are held at the logic at the time T11.

(Time T13: Operation Period of Pulse Transit Circuit 10)

When the output signal D3 at the "L" level from INV3 is input to INV4, the output signal D4 of INV4 is changed from the "L" level to the "H" level, and the other output signals D1 to D3, and D5 to D9 are held at the logic at a time T12.

(Time T14: Operation Period of Pulse Transit Circuit 10)

When the output signal D4 at the "H" level from INV4 is input to INV5, the output signal D5 of INV5 is changed from the "H" level to the "L" level, and the other output signals D1 to D4, and D6 to D9 are held at the logic at the time T13.

(Time T15: Operation Period of Pulse Transit Circuit 10)

When the output signal D5 at the "L" level from INV5 is input to INV6, the output signal D6 of INV6 is changed from the "L" level to the "H" level, and the other output signals D1 to D5, and D7 to D9 are held at the logic at the time T12.

(Time T16: Operation Period of Pulse Transit Circuit 10)

When the output signal D6 at the "H" level from INV6 is input to INV7, the output signal D7 of INV7 is changed from the "H" level to the "L" level. Further, when the output signal D6 at the "H" level from INV6 and the output signal D8 at the "L" level from INV8 are input to NOR9, the output signal D9 of NOR9 is changed from the "H" level to the "L" level and other output signals D1 to D6 and D8 are held at the logic at the time T15.

The pulse signal transiting the pulse transit circuit 10 transits all the inverting circuits (the 9 stages of NOR1, NOR9, and INV2 to INV8) of the pulse transit circuit 10 in a first period (an odd period that is a time period from the time T1 to the time T9), but transits only some of the inverting circuits (7 stages of NOR1, NOR9, and INV2 to INV6) of the pulse transit circuit 10 in a second period (an even period that is a time period from the time T10 to a time T16). In this disclosure, a time period in which the logic of the output signal of NOR1, which is the inverting circuit of the first stage to which the drive control signal PA is input, is inverted and maintained is defined as one period.

For example, attention will be paid to the output signal D7 of INV7 and the output signal D9 of NOR9. If times at which the respective output signals of INV7 and NOR9 are changed from an "L" level to an "H" level are compared with each other in the first period, the output signal D9 of NOR9 is delayed by an amount corresponding to two inverting circuits from the output signal D7 of INV7. On the other hand, in the second period, the respective output signals of INV7 and NOR9 are simultaneously changed from the "H" level to the "L" level. Thereby, the total stages of the inverting circuits in the pulse transit circuit 10 that the pulse signal transits in the first period (odd period) and the second period (even period) are 16 stages, i.e., a power of 2-stages.

Since the operation from the time T1 to the time T16 is iteratively performed in a time period from a time T17 to a time T315, a description of the operation from the time T17 to the time T315 will be omitted. In arbitrary time from the time T17 to the time T315, the external control signal CLK is changed from an "H" level to an "L" level, but does not have an influence on the respective output signals D1 to D9 of the pulse transit circuit 10.

(Time T316: Operation Period of Pulse Transit Circuit 10)

When the output signal D2 at an "H" level from INV2 is input to INV3, the output signal D3 of INV3 is changed from the "H" level to the "L" level, and the other output signals D1, D2, D4 to D9 are held at the logic at the time T11.

The external control signal CLK at an "H" level is input to the pulse transit position detection circuit 11 and the pulse transit position detection circuit 12. The pulse transit position detection circuit 11 detects the transit position D10 of the pulse signal transiting the pulse transit circuit 10. The pulse transit position detection circuit 12 detects the circling number D11 of the pulse signal transiting the pulse transit circuit 10. More specifically, the pulse transit position detection circuit 11 holds the logics of the respective output signals D1 to D9 of the pulse transit circuit 10, and then detects information of a position at which the output signals of the neighboring inverting circuits (e.g., the output signal D1 and the output signal D2, the output signal D2 and the output signal D3, . . . , and the output signal D9 and the output signal D1) have the same logic (at the time T316, the output signal D3 and the output signal D4), and the logic of the output signal D9 (the "H" level at the time T316).

The pulse transit position detection circuit 11 encodes the transit position of the pulse signal in 4 bits according to the output signal of the inverting circuit of a previous stage (the output signal D3 at the time T316) and the logic of the output signal D9 (the "H" level at the time T316) in the detected position information, and outputs the encoded transit position as an output signal D10 to the digital signal generation circuit 13. At the time T316, the output signal D10 is 1.1.0.0 from an upper bit side.

Hereinafter, encoding in the pulse transit position detection circuit 11 will be described in detail. As described above, the pulse signal transiting the pulse transit circuit 10 passes through the 9-stage inverting circuits in the first period (odd period) and the 7-stage inverting circuits in the second period (even period). Accordingly, the pulse signal passes through a total of 16-stage inverting circuits in the first and the second periods.

Next, the transit position D10 of the pulse signal detected by the pulse transit position detection circuit 11 is determined by both the position at which the output logics of the neighboring inverting circuits are the same, and the output logic.

For example, at the time T316, the output signal D3 and the output signal D4 have the same logic, and the transit position D10 is determined according to a combination of the output signal D3 of the previous stage and the output logic L of the output signal (D10 is 1.1.0.0 because the output logic is L at the transit position of D3), as shown in FIG. 5.

Meanwhile, the pulse transit position detection circuit 12 detects the number of times the pulse signal circles the pulse transit circuit (the number of pulse signals detected from the output signal D9 in the even period), calculates a product of the number of times the pulse signal circles and a total stage number of inverting circuits (16 stages) in 6 bits, and outputs the product, as an output signal D11, to the digital signal generation circuit 13. Since the number of times the pulse signal circles is 19 at the time T316, the output signal D11 is 0.1.0.0.1.1 from an upper bit side.

The digital signal generation circuit 13 synthesizes the output signal D10 from the pulse transit position detection circuit 11 with the output signal D11 from the pulse transit position detection circuit 12, in which the output signal D10 forms lower bits and the output signal D11 forms upper bits, to thereby generate a digital signal DT, and outputs the digital signal DT to a circuit of a subsequent stage, which is not shown. At the time T316, the digital signal DT is 0.1.0.0.1.1.1.1.0.0 from an upper bit side.

Since in times after the time T317, an operation after the time T13 is iteratively performed until the external control signal CLK is changed again from the "L" level to the "H" level, a description thereof will be omitted.

As described above, the pulse transit circuit 10 in the A/D conversion circuit 100 according to the present embodiment includes the 9-stage inverting circuits, but the pulse signal passes through the 9-stage inverting circuits in the first period and the 7-stage inverting circuits in the second period, such that the transit position of the pulse signal can be detected by a power of 2 stages (16 stages). Further, in the A/D conversion circuit 100 according to the present embodiment, TpdLH and TpdHL of each inverting circuit are substantially the same and transit intervals of the pulse signals (periods H and L in the output signals of the respective inverting circuits) are set to be the same, such that the transit position of the pulse signal can be detected in units of inverting circuit (in a minimum unit). Thereby, the A/D conversion circuit 100 according to the present embodiment has A/D conversion accuracy that is twice as high as the conventional pulse phase difference encoding circuit 200.

In other words, in order to detect the transit position of the pulse signal in 4 bits, the conventional pulse phase difference encoding circuit 200 requires 32-stage inverting circuits, whereas the A/D conversion circuit 100 according to the present embodiment requires 9-stage inverting circuits. Accordingly, a circuit scale of the A/D conversion circuit necessary to obtain the same A/D conversion accuracy as the conventional one can be reduced.

Figure 6:
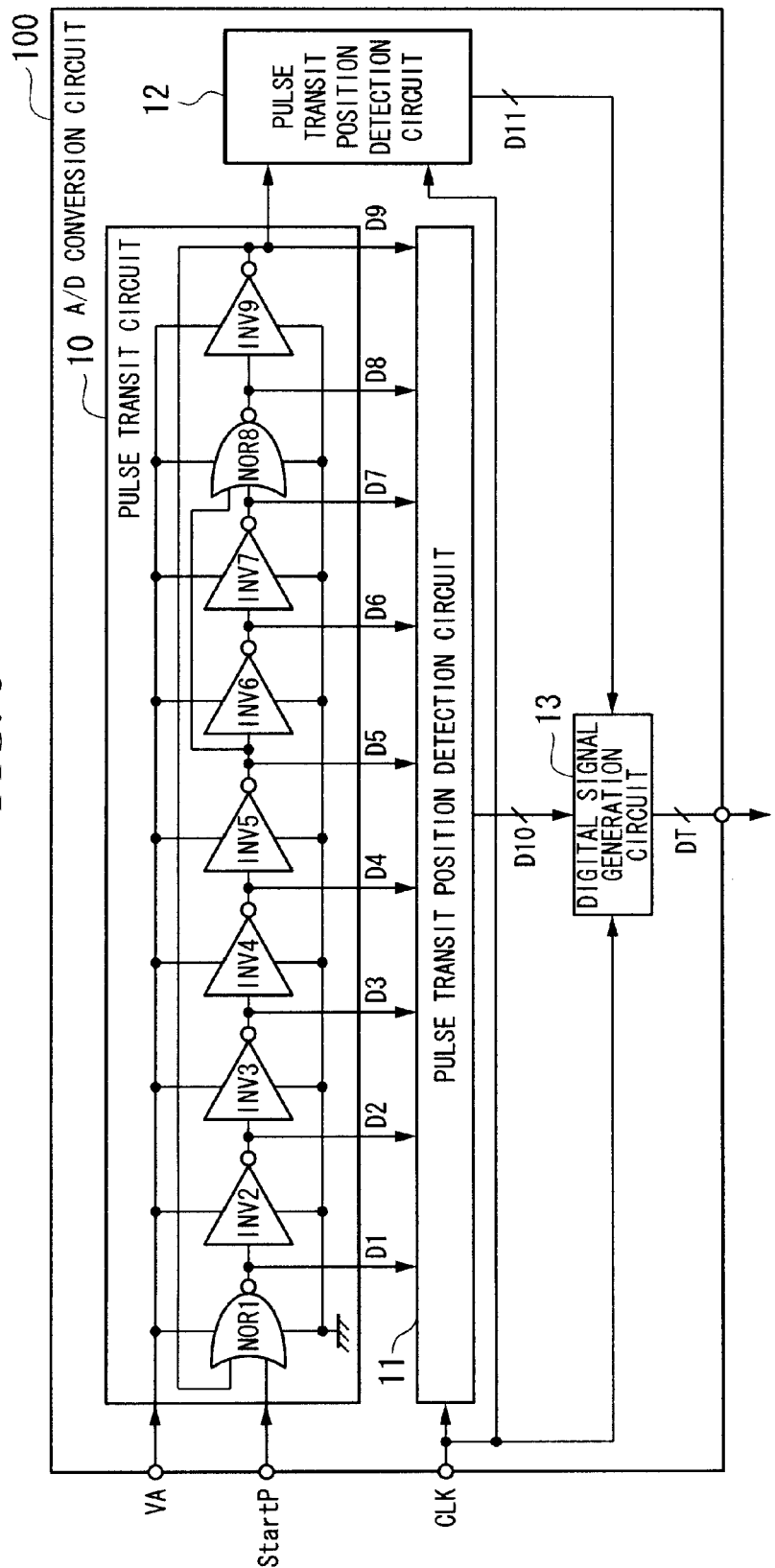
FIG. 6 is a block diagram showing a configuration of an A/D conversion circuit (variant) according to an embodiment of the present invention.

While, in the present embodiment, the output signal of INV6 is bypassed to be input to NOR9, an output signal may be input to a third inverting circuit by skipping two inverting circuits, to thereby obtain the same effect. For example, as shown in FIG. 6, the output signal of INV5 may be input to NOR8.

While, in the present embodiment, the stage number of the inverting circuits in the pulse transit circuit 10 is a sum of the stage number of inverting circuits through which the pulse signal passes in the first period (odd period) and the stage number of inverting circuits through which the pulse signal passes in the second period (even period), which is a power of 2 stages (16 stages), the same effect can be obtained with the stage number of the inverting circuits other than the 16 stages as long as the stage number of inverting circuits in the first period and the stage number of inverting circuits in the second period are the power of 2.

When a correction process is performed in a subsequent stage circuit, which is not shown, and a bypass location of the inverting circuits in the pulse transit circuit 10 is changed, the stage number of the inverting circuits in the pulse transit circuit 10 may be set to an even number or an odd number other than the power of 2, to thereby obtain the same effect. For example, 9-stage inverting circuits may be connected in series, and an output signal of one inverting circuit may be input to both the inverting circuit of a first subsequent stage and the inverting circuit of a third subsequent stage so that the transit position of the pulse signal can be detected in 4 bits. Alternatively, 11 stage inverting circuits may be connected in series, and an output signal of one inverting circuit may be input to both the inverting circuit of a first subsequent stage and the inverting circuit of a seventh subsequent stage so that the transit position of the pulse signal can be detected in 4 bits.

Figure 7:
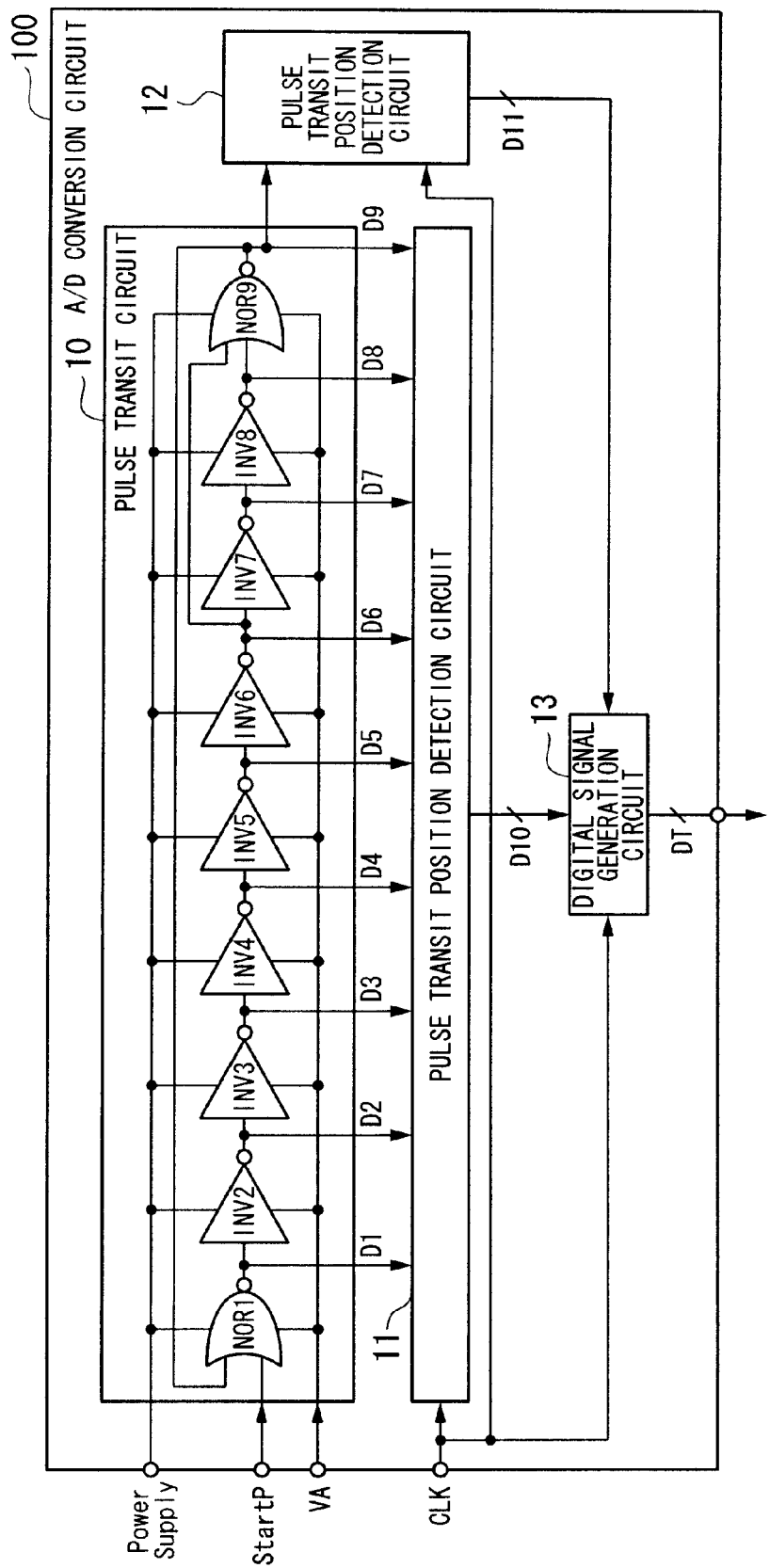
FIG. 7 is a block diagram showing a configuration of an A/D conversion circuit (variant) according to an embodiment of the present invention.

While, in the present embodiment, the highest potential for the inverting circuit in the pulse transit circuit 10 is the external analog input signal VA and the lowest potential is GND, which is not shown, as shown in FIG. 7, the highest potential for the inverting circuit in the pulse transit circuit 10 may be a supply voltage which is not shown and the lowest potential may be the analog input signal VA to obtain the same effect.

Figure 8:
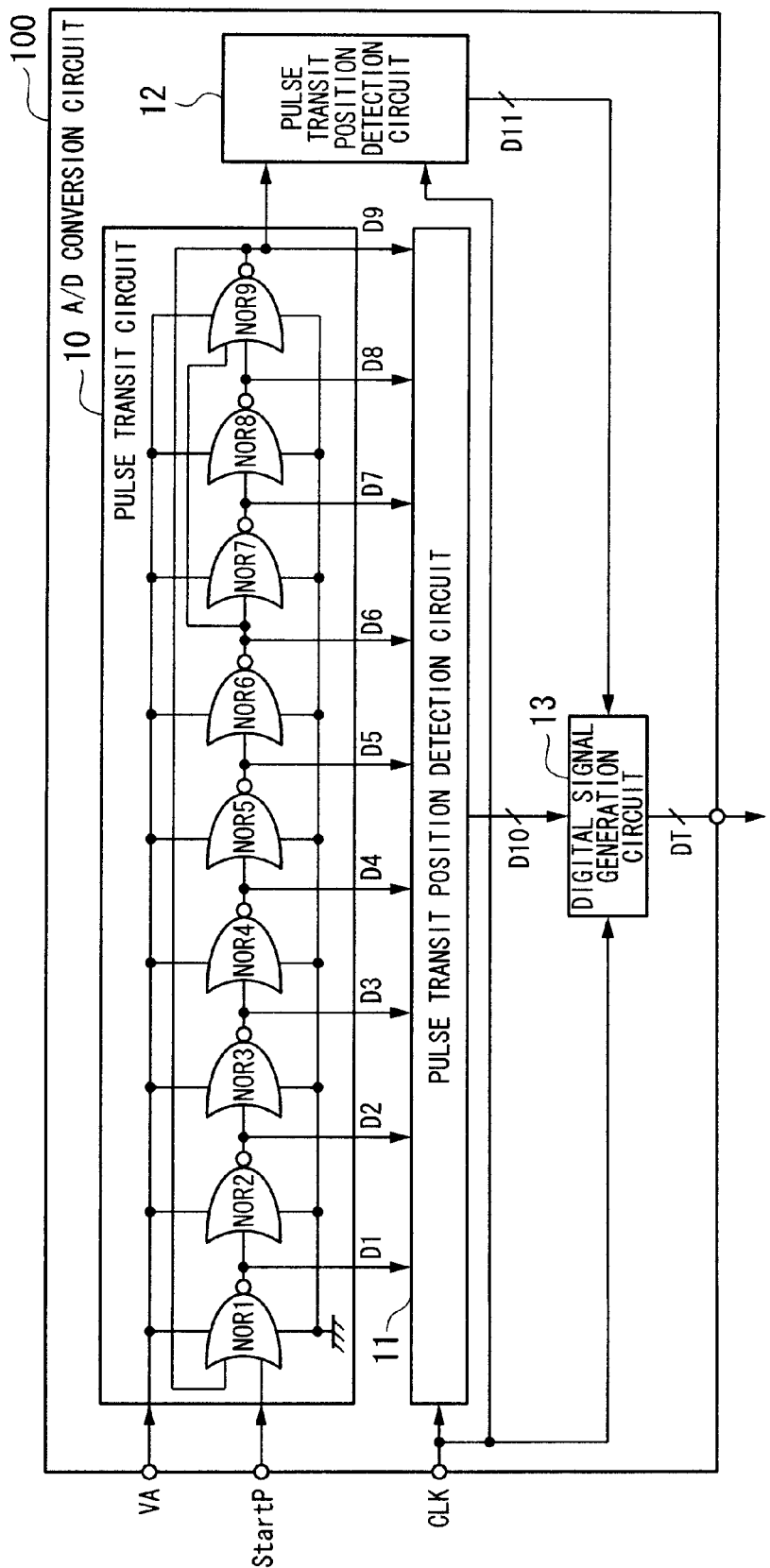
FIG. 8 is a block diagram showing a configuration of an A/D conversion circuit (variant) according to an embodiment of the present invention.

While, in the present embodiment, the inverting circuits in the pulse transit circuit 10 are two NOR circuits NOR1 and NOR9 and the seven INV circuits INV2 to INV8, all inverting circuits may be NOR circuits NOR1 to NOR9 as shown in FIG. 8 to obtain the same effect. Although not shown, GND is connected to the other inputs of NOR2 to NOR8 in FIG. 8.

Figure 9:
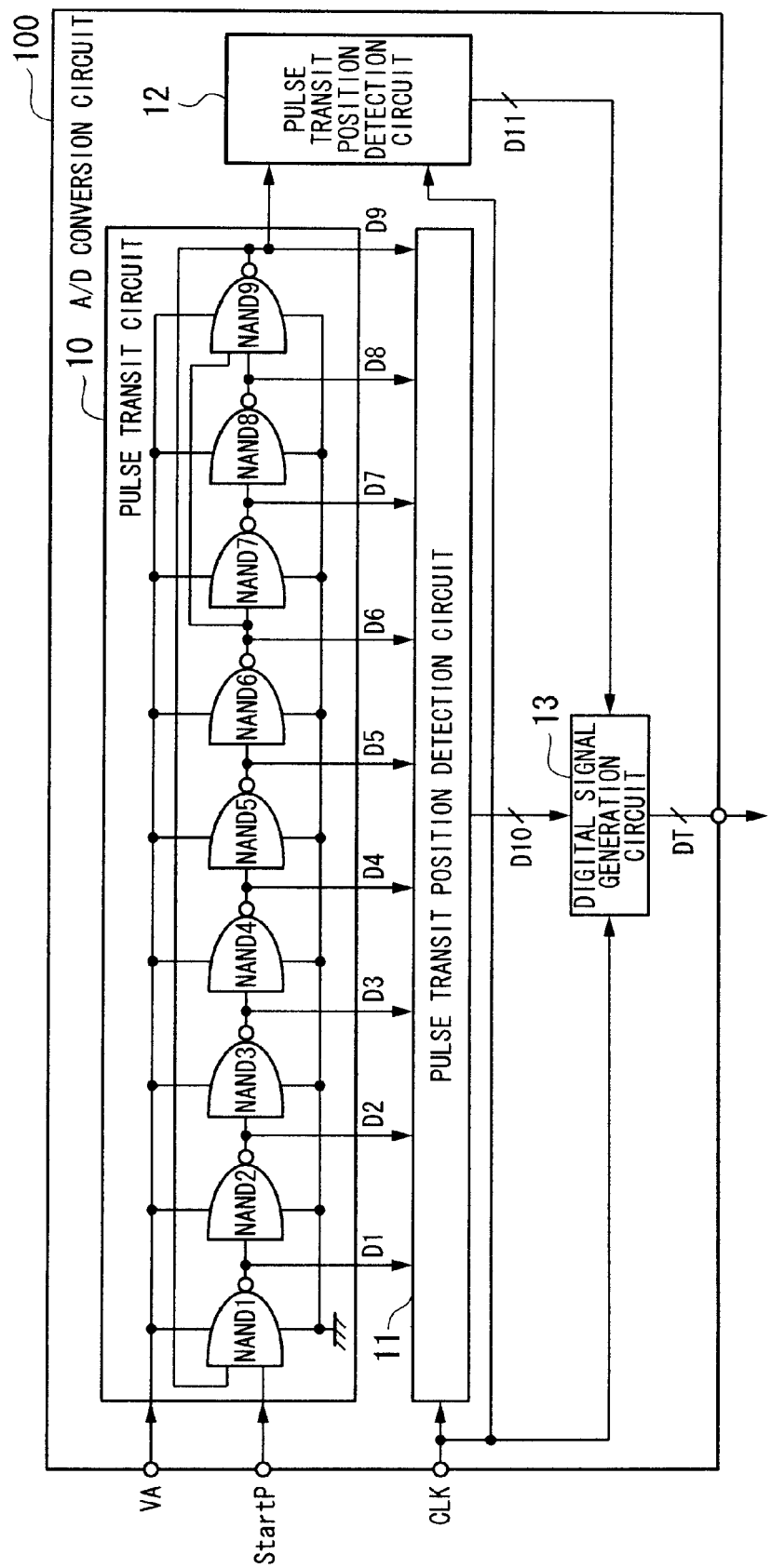
FIG. 9 is a block diagram showing a configuration of an A/D conversion circuit (variant) according to an embodiment of the present invention.

While, in the present embodiment, the inverting circuits in the pulse transit circuit 10 are two NOR circuits (NOR1 and NOR9) and the seven INV circuits (INV2 to INV8), all the inverting circuits may be NAND circuits NAND1 to NAND9 as shown in FIG. 9, to obtain the same effect. Although not shown, the analog input signal VA or the supply voltage is connected to the other inputs of NAND2 to NAND8 in FIG. 9.

Figure 10:
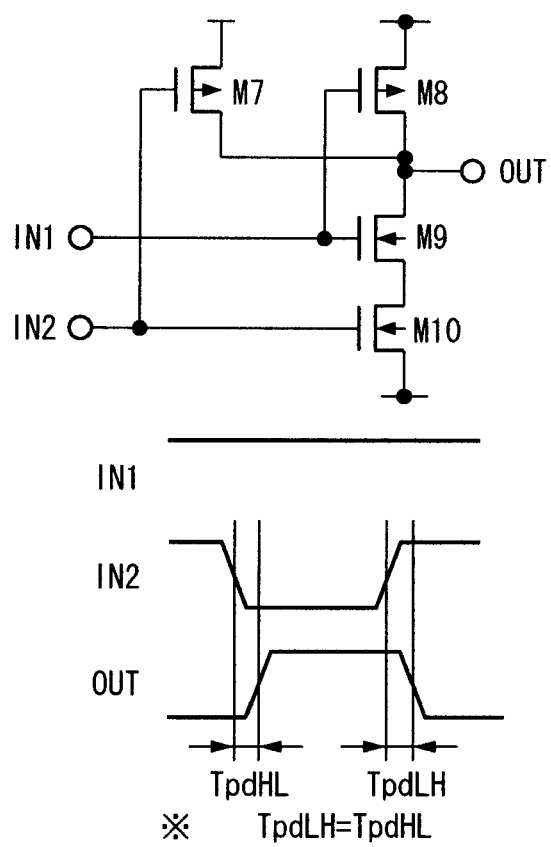
FIG. 10 is a reference diagram showing a characteristic of an inverting circuit according to an embodiment of the present invention.
Figure 11:
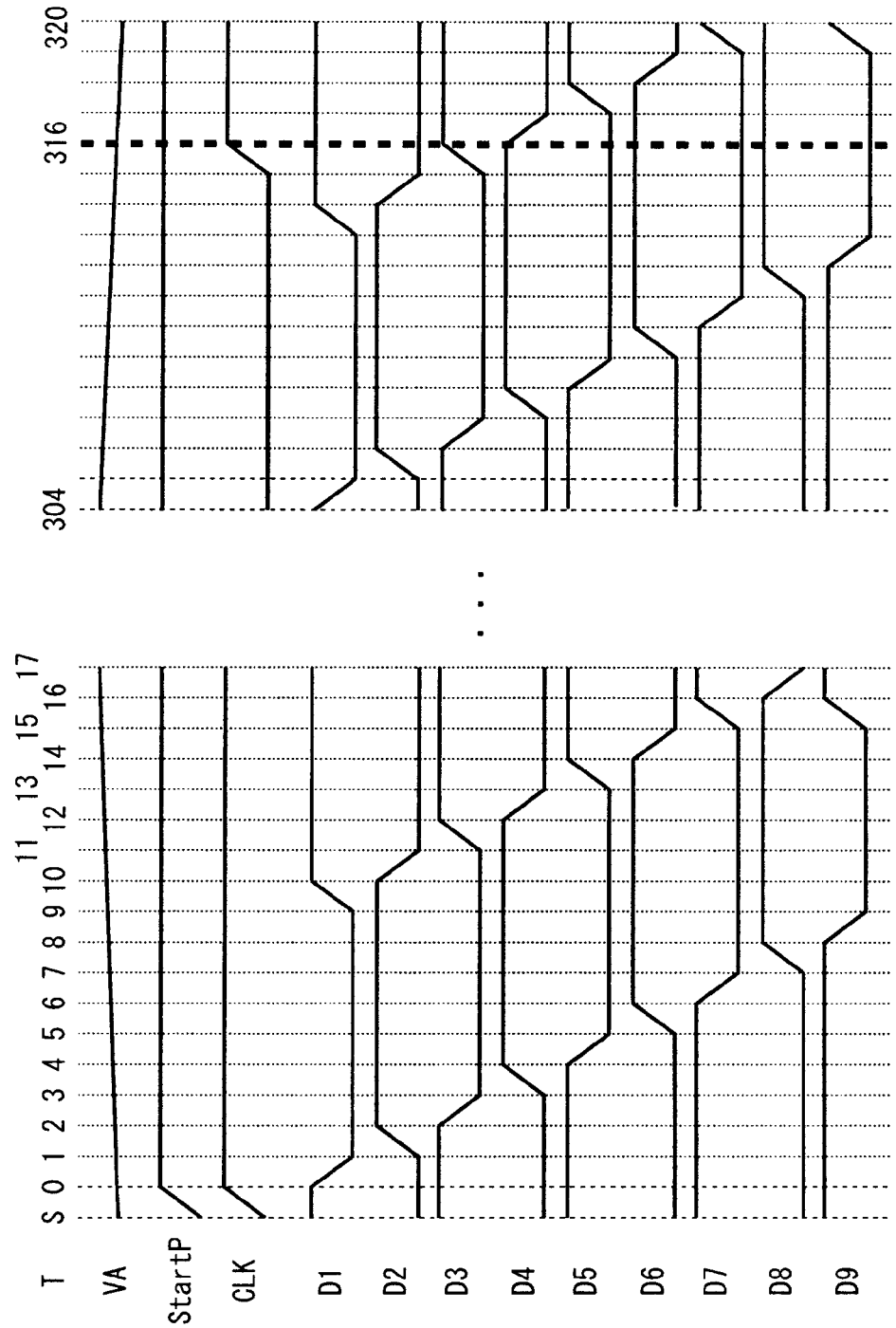
FIG. 11 is a timing chart showing operation of an A/D conversion circuit (variant) according to an embodiment of the present invention.
Figure 12:
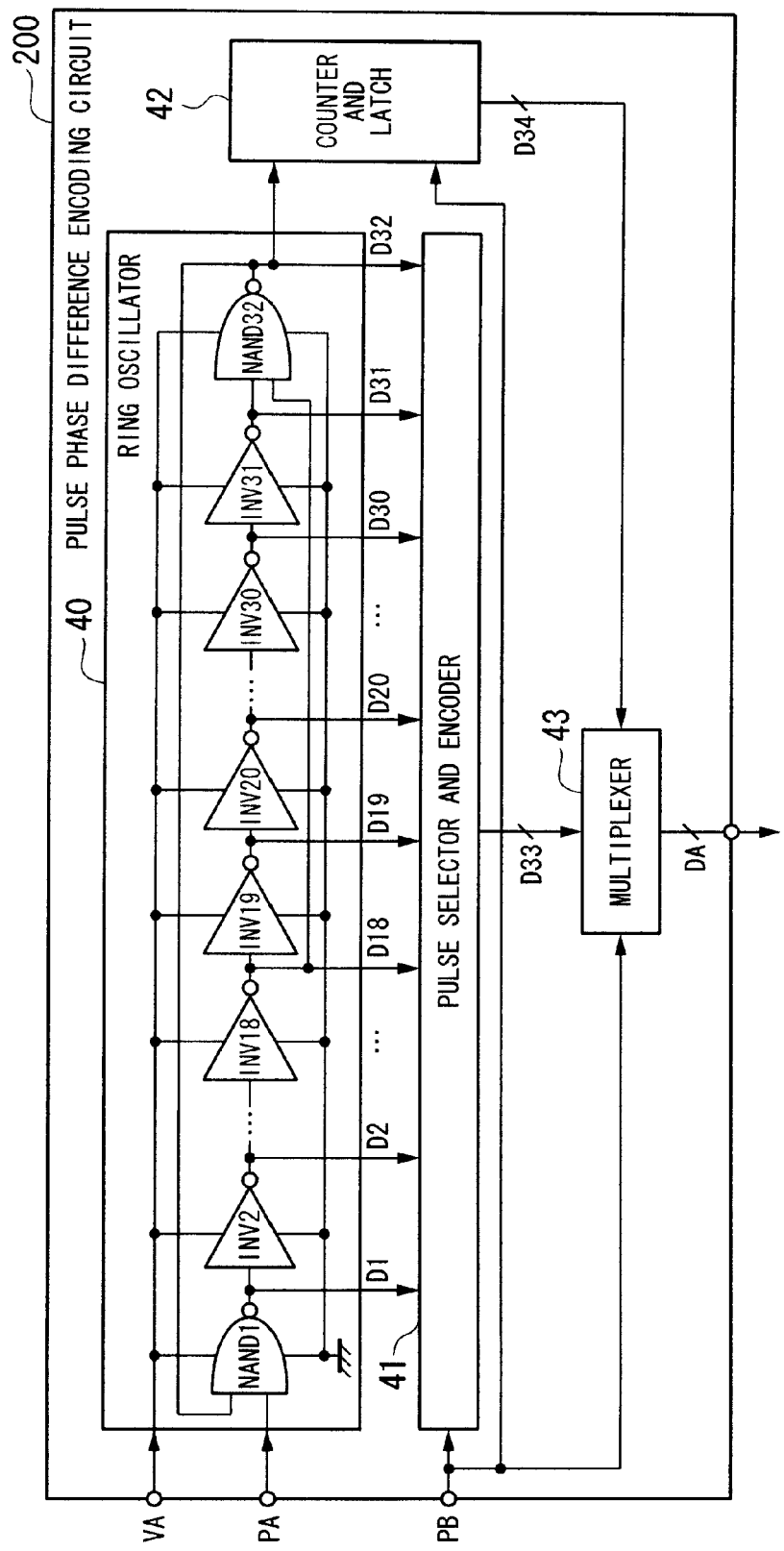
FIG. 12 is a block diagram showing a configuration of a conventional pulse phase difference encoding circuit.
Figure 13:
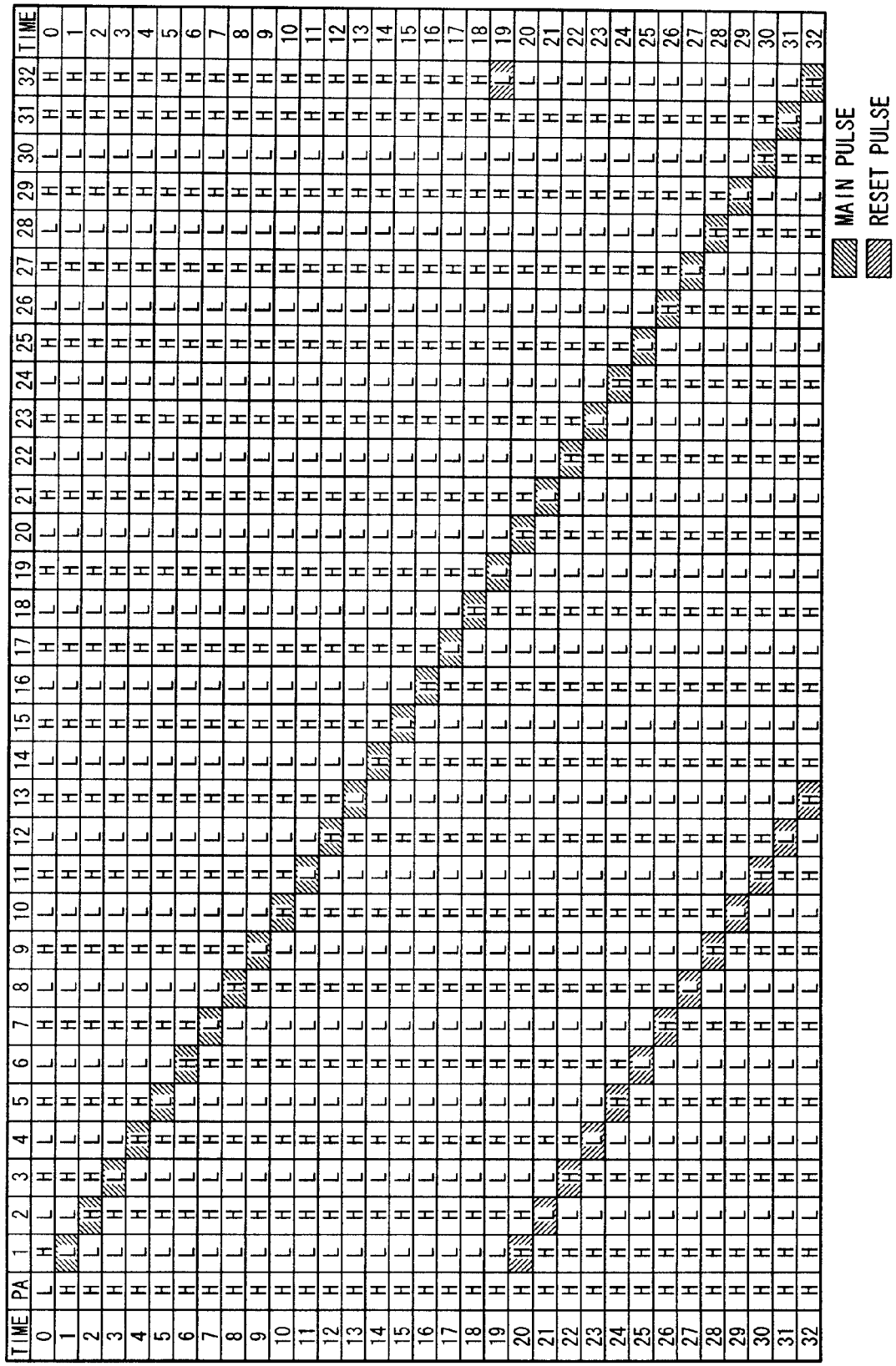
FIG. 13 is a reference diagram showing a logical state of an inverting circuit in the conventional pulse phase difference encoding circuit.
Figure 14:
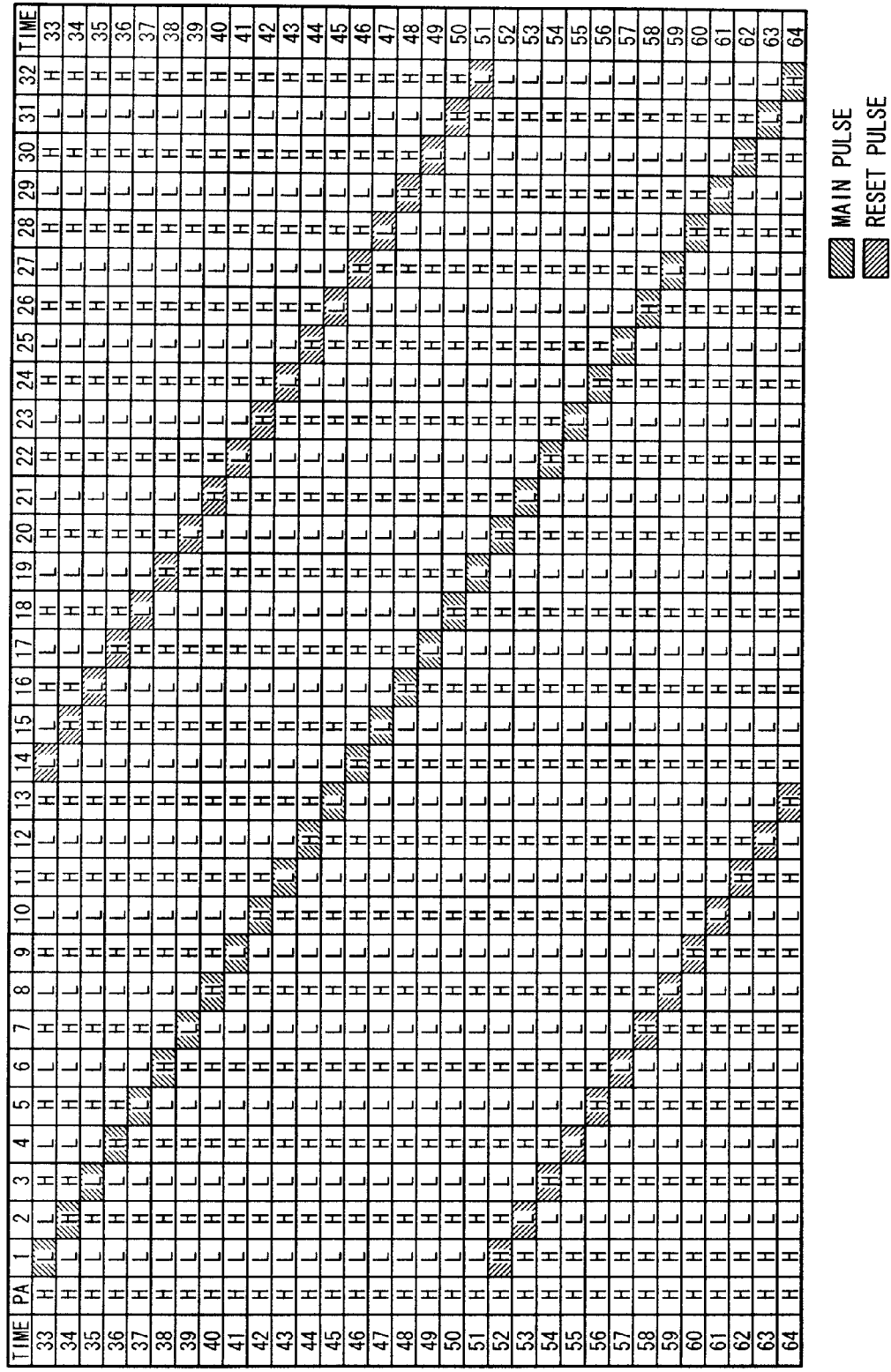
FIG. 14 is a reference diagram showing a logical state of an inverting circuit in the conventional pulse phase difference encoding circuit.
Figure 15:
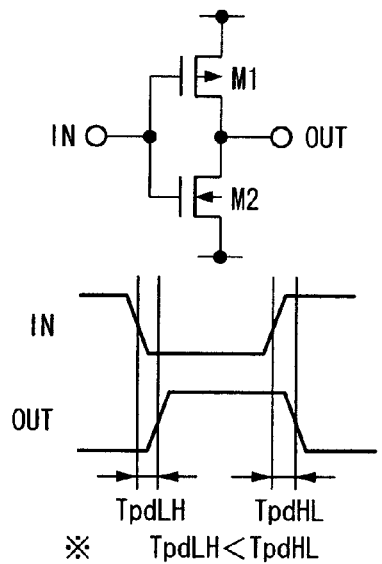
FIG. 15 is a reference diagram showing a characteristic of a conventional inverting circuit.
Figure 16:
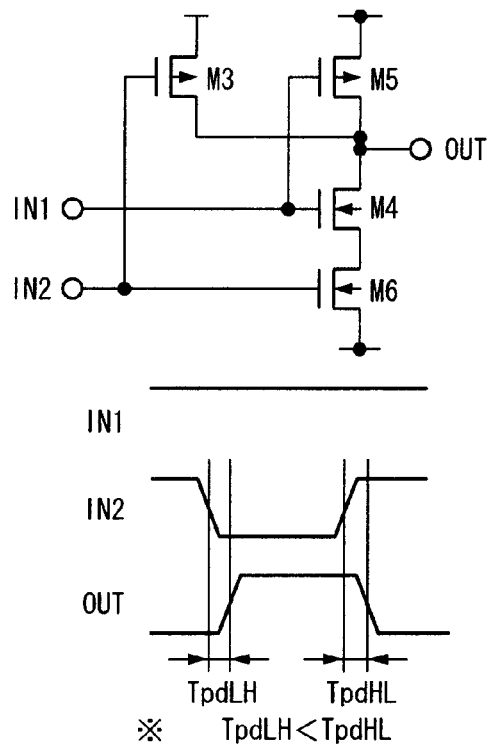
FIG. 16 is a reference diagram showing a characteristic of a conventional inverting circuit.
Figure 17:
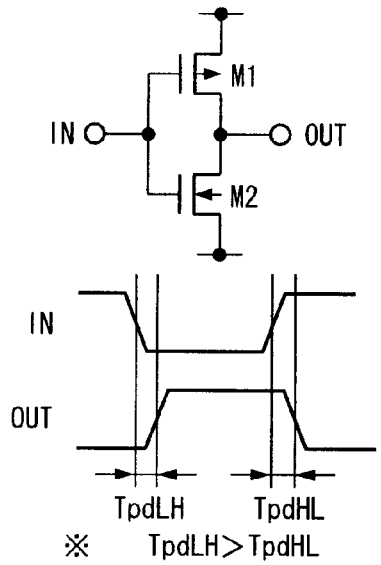
FIG. 17 is a reference diagram showing a characteristic of a conventional inverting circuit.
Figure 18:
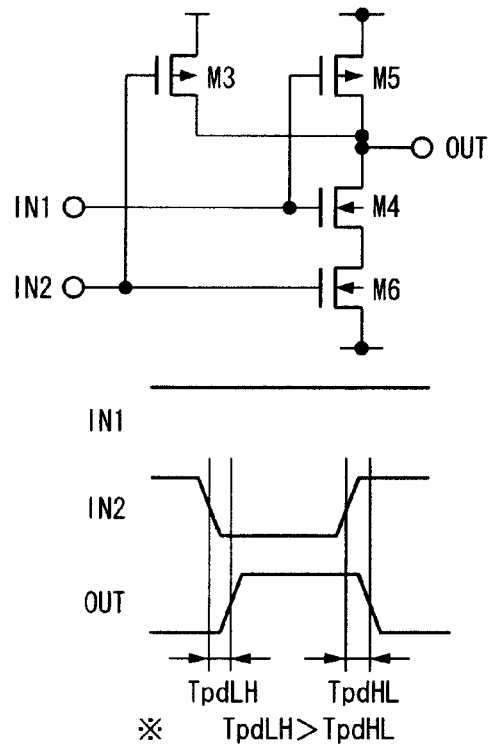
FIG. 18 is a reference diagram showing a characteristic of a conventional inverting circuit.

FIG. 10 shows TpdLH and TpdHL of NAND1 to NAND9. FIG. 11 shows operation of a pulse transit circuit 10 shown in FIG. 9. As shown in FIG. 11, an external drive control signal StartP and output signals D1 to D9 of respective inverting circuits in the pulse transit circuit 10 have logics inverted from those in FIG. 4, but the same effect can be obtained by performing the same signal processing.

While, in the present embodiment, the pulse signal transiting the pulse transit circuit 10 passes through all of the inverting circuits in the first period and some of the inverting circuits in the second period, the pulse signal may pass through some of the inverting circuits in the first period and all the inverting circuits in the second period.

While the embodiment of the present invention has been described with reference to the accompanying drawings, a concrete configuration is not limited to the embodiment, but may be changed without departing from the spirit and scope of the present invention. The present invention is not limited by the above-described description, and is limited only by the claims.

What is clamed is:

1. An A/D conversion circuit comprising:
   a pulse transit circuit including inverting circuits, each inverting circuit including a logical element in which a delay time of an output pulse signal is changed with a size of an applied analog signal, the inverting circuits being connected as odd stages, an output signal from the inverting circuit of a last stage being input to an inverting circuit of a first stage, and an output signal from the inverting circuit of arbitrary stage being input to both the inverting circuit of a first subsequent stage and the inverting circuit of any other subsequent stage;
   a first pulse transit position detection circuit detecting a transit position of the pulse signal output from the pulse transit circuit and generating a logical signal according to the transit position;
   a second pulse transit position detection circuit detecting a circling number of the pulse signal output from the pulse transit circuit and generating a logical signal according to the circling number; and
   a digital signal generation circuit synthesizing the logical signals output from the first and second pulse transit position detection circuits and generating a digital signal according to the size of the analog signal,
   wherein the pulse transit circuit is configured so that a sum of the number of the inverting circuits that the pulse signal transits in an N-th period and the number of the inverting circuits that the pulse signal transits in an (N+1)-th period is a power of 2, wherein the N denotes a natural number.

2. The A/D conversion circuit according to claim 1, wherein an output signal from the inverting circuit of arbitrary stage in the pulse transit circuit is input to both the inverting circuit of a first subsequent stage and the inverting circuit of a third subsequent stage.

3. The A/D conversion circuit according to claim 1, wherein each inverting circuit includes a NOR circuit.

4. The A/D conversion circuit according to claim 1, wherein each inverting circuit includes a NAND.

* * * * *